United States Patent [19]
Padmanabhan

[11] Patent Number: 5,731,223
[45] Date of Patent: Mar. 24, 1998

[54] ARRAY OF SOLDER PADS ON AN INTEGRATED CIRCUIT

[75] Inventor: Gobi R. Padmanabhan, Sunnyvale, Calif.

[73] Assignee: LSI Logic Corporation, Milpitas, Calif.

[21] Appl. No.: 719,266

[22] Filed: Sep. 24, 1996

[51] Int. Cl.$^6$ ........................................... H01L 21/44
[52] U.S. Cl. .................. 437/183; 437/187; 437/189; 437/195
[58] Field of Search ..................... 437/183, 184, 437/187, 189, 195, 209

[56] References Cited

U.S. PATENT DOCUMENTS

| | | | |
|---|---|---|---|
| 4,161,662 | 7/1979 | Malcolm et al. | 307/213 |
| 4,602,271 | 7/1986 | Dougherty et al. | 357/80 |
| 4,783,695 | 11/1988 | Eichelberger et al. | 357/65 |
| 4,866,508 | 9/1989 | Eichelberger et al. | 357/74 |
| 4,980,034 | 12/1990 | Volfson et al. | 437/195 |
| 4,990,996 | 2/1991 | Kumar et al. | 357/68 |
| 5,055,973 | 10/1991 | Mohsen | 361/414 |
| 5,066,831 | 11/1991 | Spielberger et al. | 174/52.4 |
| 5,081,561 | 1/1992 | Smith | 361/400 |
| 5,165,166 | 11/1992 | Carey | 29/847 |
| 5,196,362 | 3/1993 | Suzuki | 437/195 |
| 5,220,490 | 6/1993 | Weigler et al. | 361/409 |
| 5,264,664 | 11/1993 | McAllister et al. | 174/261 |
| 5,273,910 | 12/1993 | Tran et al. | 437/195 |
| 5,311,059 | 5/1994 | Banerji et al. | 257/778 |
| 5,366,911 | 11/1994 | Lur et al. | 437/192 |
| 5,413,962 | 5/1995 | Lur et al. | 437/195 |
| 5,422,515 | 6/1995 | Endo | 257/691 |
| 5,424,589 | 6/1995 | Dobbelaere et al. | 326/41 |
| 5,426,263 | 6/1995 | Potter et al. | 174/52.4 |
| 5,444,015 | 8/1995 | Aitken et al. | 437/182 |
| 5,514,613 | 5/1996 | Santaurga et al. | 437/195 |
| 5,580,825 | 12/1996 | Labunov et al. | 437/195 |
| 5,607,873 | 3/1997 | Chen et al. | 437/195 |

Primary Examiner—Kevin Picardat
Attorney, Agent, or Firm—Hickman Beyer & Weaver, LLP

[57] ABSTRACT

Disclosed is a die structure which allows some or all routing to be performed in an integrated circuit packaging substrate (e.g., a package or circuit board). The packaging substrate acts as one or more interconnect levels. The die and packaging substrate arrangement takes the form of a flip chip design in which multiple solder bumps are formed on an active surface of the die. The active surface is largely or fully "populated" with such solder bumps to allow electrical connection to the packaging substrate at many different sites, depending upon the specific design employed. The solder bumps are electrically connected to various device elements or circuit components on the die itself. In this manner, many different integrated circuit designs may be implemented with the die (in the manner of a gate array) by employing different routing arrangements in the packaging substrate and allowing contact with subsets of the solder pad array.

6 Claims, 4 Drawing Sheets

ARRAY OF SOLDER PADS ON AN INTEGRATED CIRCUIT

BACKGROUND OF THE INVENTION

This invention relates to integrated circuit ("IC") dies including an array of solder pads electrically coupled to device elements, and containing no wiring or incomplete wiring between such device elements. More particularly, the invention relates to dies having an array of solder pads (in the manner of flip chip) that allow connection between the various transistor elements and connect to a customized packaging substrate which provides the wiring necessary to complete the integrated circuit ("IC").

Most conventional IC fabrication process steps can be characterized as either "front end" steps or "back end" steps. Front end steps generally include those steps necessary to form the actual transistor elements such as source/drain regions, gates, and isolation regions. Back end steps generally include those steps necessary to create circuitry by wiring the various transistors formed by the front end processing. The circuitry created in the back end steps includes complicated line routing patterns (or "wiring") between transistors at the integrated circuit substrate level. The wiring is provided as conductive vertical interconnects and patterned horizontal metallization layers sitting in a layered stack above the substrate. Dielectric layers electrically insulate the metallization layers from one another and from the substrate.

In gate arrays, the front end steps yield a repeating array of "base cells" each having a defined number and arrangement of transistors. This array of base cells (sometimes called a "masterslice"), being without wiring, can be used with many different integrated circuits. Typically, gate arrays are used for producing low volume application specific integrated circuits (ASICs). Building an integrated circuit from a gate array masterslice requires performing "customized" back end processing to define wiring unique to the end user's needs.

Unfortunately, all wiring in a gate array (or any IC for that matter) is typically provided by the above-described back end processing. As layer after layer of metallization is provided, the risk of wiring failure increases. Further, some ASIC customers may not have conventional back end processing facilities available and therefore require an alternative to the conventional back end processing to provide the wiring necessary for their applications.

In view of the foregoing, it would be desirable to allow for flexible IC wiring (particularly for gate arrays) but not require conventional back-end fabrication of interconnects, patterned metallization layers, etc. directly on an IC die.

SUMMARY OF THE INVENTION

The present invention provides a die structure which allows some or all routing to be performed in an integrated circuit packaging substrate (e.g., a package or circuit board). Thus, the packaging substrate acts as one or more interconnect levels. Preferably the die and packaging substrate arrangement takes the form of a flip chip or other package design in which multiple solder bumps (sometimes referred to herein as "solder pads") are formed on an active surface of the die. In this invention, the active surface is largely or fully "populated" with solder bumps to allow electrical connection to the packaging substrate at many different sites, depending upon the specific design employed. The solder bumps are electrically connected to various device elements or circuit components on the die itself. In this manner, many different integrated circuit designs may be implemented with the die (in the manner of a gate array) by employing different routing arrangements in the packaging substrate and allowing contact with subsets of the solder pad array. Of course, the present invention is not limited to gate array designs and may be used with cell based or other possible IC designs.

In one aspect, the present invention provides an integrated circuit/package which may be characterized as including the following elements: (a) a die having (i) a plurality of electronic devices with incomplete wiring therebetween and (ii) a plurality of solder pads electrically connected to the electronic devices; and (b) a packaging substrate having wiring with contacts positioned to make electrical contact with at least some of the solder pads when the die is mounted on the packaging substrate. The die itself includes insufficient wiring to and from the electronic devices to form the integrated circuit, so one or more layers of wiring in the packaging substrate are employed to complete the integrated circuit. Typically, the die will include (i) a semiconductor substrate containing the plurality of electronic devices, (ii) one or more dielectric layers provided over the substrate, and (iii) the plurality of solder pads provided on a top dielectric layer of the one or more dielectric layers.

The packaging substrate may include power and ground planes and electrical connections thereto disposed at locations allowing contact to some of the solder pads when the die is mounted on the packaging substrate. By allowing the solder pads to connect directly to the power and ground planes wherever desired, the device performance may be increased and the flexibility in routing power and ground may be enhanced. In addition, input and output pads and cells may be provided wherever desired on the IC active surface, rather than being limited to a specific region such as the IC periphery. Thus, I/O signals can be delivered to or taken from the actual locations where they are provided/required by the IC.

Many possible approaches to dividing the routing between the die and the packaging substrate are possible. Thus, packaging substrate may include a majority or minority of the wiring. In some cases, the wiring will take the form of one or more layers (some of which may be power and ground planes). The die itself may include no wiring or some limited amount of wiring. If the die includes no wiring, a single dielectric layer (or passivation layer) is provided over the electronic devices and includes a plurality of vias containing interconnects which electrically connect the device elements to the solder pads. The solder pads are then disposed upon a top surface of the single dielectric layer. In other approaches, one or more patterned metallization layers (defining metal lines connecting at least some of the electronic devices) are provided on the die. The metallization layers are separated from one another, from the substrate, and from the array of solder pads by dielectric layers. If wiring is provided on the die, it may preferably define intracell routing, but may alternatively define intercell routing or some combination of intra and intercell routing.

Preferably, the plurality of solder pads are arranged evenly over the surface of the top dielectric layer to allow flexibility in making connections to the packaging substrate. Typically, though not necessarily, the plurality of solder pads will include more solder pads than are necessary to complete wiring to form the integrated circuit. In other words, some solder pads will be unused in when connected to the packaging substrate. This of course depends upon the needs of the user who can make selective use of many or all of the devices on the die.

In another aspect, the present invention provides a method of fabricating a die, such as described above, having a plurality of electronic devices and incomplete wiring therebetween. The method may be characterized as including the following steps: (a) forming the plurality of electronic devices on a semiconductor substrate; (b) forming a passivation layer over the electronic devices on the semiconductor substrate; (c) forming conductive pathways from device elements of the plurality of electronic devices to an outer surface of the die (e.g., the top surface of a top dielectric layer); and (d) forming a plurality of solder pads on the outer surface and in electrical contact with the conductive pathways, wherein the conductive pathways include insufficient wiring to and from the electronic devices to form an integrated circuit.

Of course, the methods of this invention may include other steps necessary to form the above-described structures. Thus, for example, the method may include steps of (i) forming a metallization layer over the passivation layer; (ii) patterning the metallization layer to form conductive lines defining at least some portions of the conductive pathways; and (iii) forming a dielectric layer over the conductive lines.

In order to form the pad array of this invention, only a single mask is required as opposed several masks. Thus, a die used for many applications may require only a single pad array mask, thereby greatly simplifying the procedure of making the die—which may then be used for many different applications (e.g., ASICs). In a preferred embodiment, as many pads will be printed as can be fit on the die active surface. The number of pads thus depends upon the size of the die and the fabrication technology's current lithographic/processing constraints.

These and other features and advantages of the invention will be described in more detail below with reference to the drawings.

DETAILED DESCRIPTION OF THE PREFERRED EMBODIMENTS

The present invention provides a modified flip chip die and package design. In this invention, solder pads are provided in great abundance over the surface of die. A customizable package containing some routing connects to some of solder pads. In the following description, numerous specific details are set forth in order to provide a thorough understanding of the present invention. It will be apparent, however, that the present invention may be practiced without limitation to some of the specific details presented herein.

Figure 1:
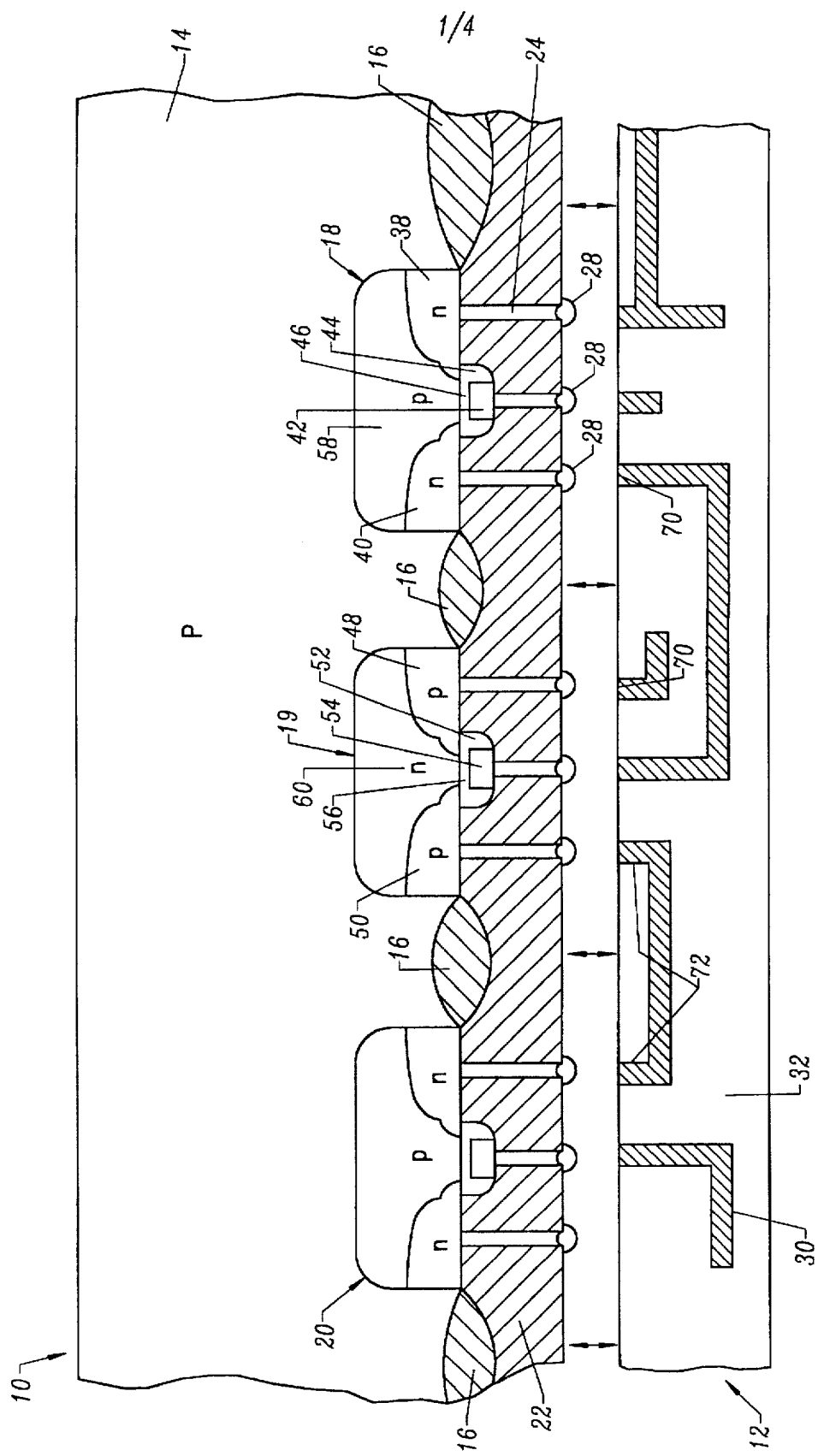
FIG. 1 shows a side-sectional view of a die and customized packaging substrate arrangement in which devices on the die are directly connected to conductive solder pads aligned to connect with some regions of the customized packaging substrate in accordance with one embodiment of the present invention.

Referring first to FIG. 1, a die 10, which may be employed in a flip-chip package design, comes equipped with solder pads 28 which provide points of electrical contact to a packaging substrate 12. Each of these elements are described in detail below.

Die 10 includes a semiconductor substrate 14 (e.g. a silicon wafer) with complementary metal oxide semiconductor (CMOS)transistor devices 18, 19 and 20 disposed on the substrate surface. Device 18 is an NMOS device and device 19 is a PMOS device, for example. As such, device 18 includes n-type doped source/drain regions 38 and 40 and a p-type well region 58 as shown. Spacers 44 adjacent to a gate oxide layer 46 and a gate electrode 42 are formed on the substrate surface as shown in FIG. 1. Device 19 includes p-type doped source/drain regions 48 and 50 and a n-type well region 60 as shown. Similar to device 18, device 19 also includes spacers 52 adjacent to a gate oxide layer 56 and a gate electrode layer 54 on the substrate surface.

A thick field oxide region 16 is formed on the substrate surface to insulate devices 18, 19 and 20 from each other. A passivation layer 22, which may include silicon dioxide, glass, e.g. borophosphosilicate glass (BPSG), etc. is disposed above selected portions of the substrate surface as shown in FIG. 1. Apertures through layer 22 define vias which provide access to the underlying transistor elements such as the source, drain and well regions. The vias are filled with a conductive materials, such as tungsten, to form vertical interconnects (e.g., an interconnect 24) providing electrical connections between device elements and an overlying conductive structure. Generally, conductive contacts will cap the interconnect to serve as points of electrical contact between the various transistor elements described above and external wiring, preferably provided in packaging substrate 12. In one preferred embodiment of the present invention, the conductive contacts include solder pads 28. The solder pads on the active face of die 10 preferably takes the form of a substantially uniform array sometimes referred to herein as a "pad array."

In preferred embodiments, the pad array includes solder pads connected to various points on the die that can accept power and ground (Vdd and Vss) sources. If power and ground planes are provided on the packaging substrate, solder bumps at appropriate locations may be connected directly thereto as necessary to increase performance and/or enhance flexibility in routing to power and ground. In conventional chip designs, power and ground are supplied only at well defined locations such as along the die periphery or along a central axis of the die. Often this is not the optimal approach because some regions of an IC far removed from the power and ground sources may consume large amounts of power. This problem may be particularly pronounced in the case on ASIC. With the present invention, however, power connections may be made directly to the regions of high power consumption through the solder pads provided throughout the IC active surface.

The present invention also allows, input-output (I/O) to made anywhere throughout the entire active surface of the die. Thus, if a signal generated within the IC interior region needs to be output, an output connection for that signal may be conveniently provided at or near the location where the signal is generated. Conversely, if an input signal is required by a particular circuit on the die, the input connection for that signal may be provided proximate the location of the circuit or device requiring that signal. Note that in many conventional packaging designs, the I/O pads must be provided on the IC periphery or along certain well defined axes of the chip. To further optimize performance, I/O cells (containing the circuitry necessary to immediately handle the I/O signals) will be provided along with the solder pads wherever required in the die surface. Thus, all the I/O processing can be conducted proximate the location where the I/O signals are required/generated. As is well known, I/O cells typically include transistors of various sizes wired to form the necessary buffers, amplifiers, etc. for handling I/O signals. I/O cells also typically include electrostatic discharge protection (ESD) devices.

In this invention, the exterior chip design, having solder pads on an active surface, may be that of a flip chip or ball grid array. A conventional flip chip may be bonded directly to a packaging substrate, without the need for a separate leadframe or for separate I/O connectors (e.g. wire or tape). Such chips are formed with ball-shaped beads or bumps of solder affixed to their I/O bonding pads. During packaging, the chip is "flipped" so that its active circuit surface faces the packaging substrate and the solder bumps form electrical connections directly between the chip and conductive traces on the packaging substrate. In current designs, the die may have dimensions on the order of 0.5 ×0.5 inch (1 inch=2.54 cm) whereas the unbonded solder bumps may have a diameter on the order of 4 to 5 mils (1 mil=$10^{-3}$ inch=0.0254 mm). To mount the die, it is connected to the packaging substrate electrically by heating to form solder joints and mechanically by a cured layer of epoxy.

Packaging substrate 12 comes equipped with contact points 70 which contact corresponding solder pads 28 to establish an electrical connection between die 10 and packaging substrate 12. Packaging substrate 12 is preferably, though not necessarily, a laminated structure that includes multiple layers of conductive lines 30 separated by insulating layers 32. Conductive line layers 30 positioned between insulating layers 32 are connected to each other by vertical connections 72 forming a network of conductive pathways, which connect the various transistor elements of die 10 as necessary. By way of example, FIG. 1 shows one conductive line layer 30 that would connect source/drain region 40 of device 18 to gate electrode 54 of device 19. The number of layers, i.e. conductive line and insulating layers, contained in packaging substrate 12 may be dictated by the complexity of the circuit design implemented through packaging substrate 12.

Figure 4:
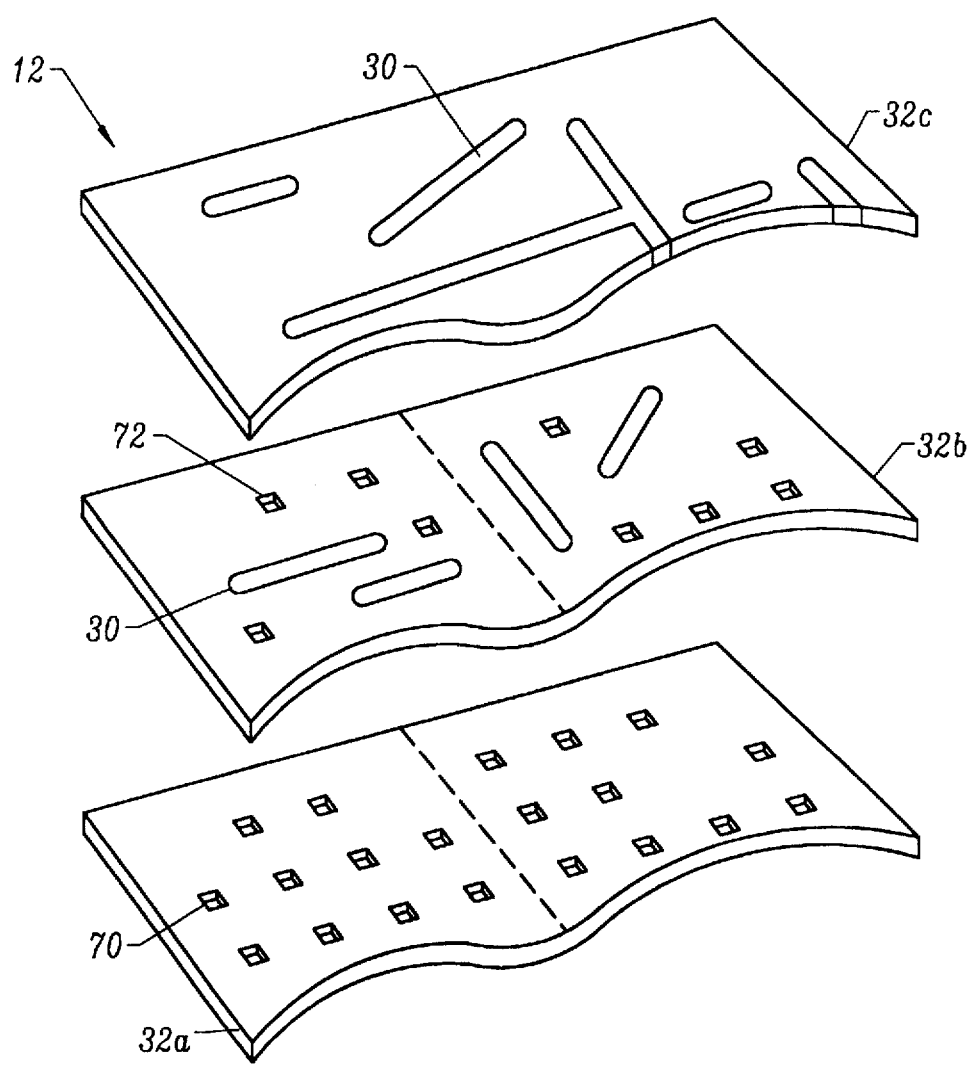
FIG. 4 shows an exploded view of the customized packaging in one embodiment of the present invention.

Packaging substrate 12 may be a printed circuit board, an IC package, or other substrate that can be mounted to transmit signals, power, and ground with the die through the solder pads. By way of example, FIG. 4, shows an exploded view of a laminated packaging substrate 12 in one embodiment of the present invention. Preferably, packaging substrate 12, as shown, includes conductive components, e.g. contact points 70 and conductive lines 30 to be formed on insulating layers 32a–c. For example, the first insulating layer 32a may include contact points 70, second insulating layer 32b may include vertical conductive lines 72 and conductive lines 30, and finally the third insulating layer 32c may include more conductive lines 30. Conductive lines 30 are preferably sized on or near the same order of magnitude as the lines on die 10. Further, lines 30 may be provided in multiple insulating layers and are not necessarily limited to any specific number. In some embodiments, one or more of the packaging substrate layers will be power or ground planes. Thus, for example, layer 32b may provide a power plane with lines 30 being held at Vdd. In this configuration, power and ground planes allow the die to tap power and ground from the package wherever necessary to optimize chip performance or routing. While many different materials may be employed to form the conductive lines and insulating layers of packaging substrate 12, some widely used materials include metal lines printed on polymeric insulators such as polyimide.

Packaging substrate may be fabricated using film methods in which a layer of dielectric is printed and fired, followed by subsequent layers of conductor and dielectric. Alternatively, the package may be fabricated as part of a multilayer ceramic circuit. In any approach, conductive material can be deposited on insulating layers by sputtering, electroless plating, electroplating, lamination, etc. Vias and vertical interconnects may be formed by various techniques well known in the art. A general discussion of some methods for forming a packaging substrate are provided in U.S. Pat. No. 5,165,166 issued Nov. 24, 1992 and incorporated herein by reference for all purposes.

In an alternative embodiment, the packaging substrate may include programmable structures such as fuse or antifuses allowing the custom IC manufacturer to define routing paths and/or circuitry in the package itself. In this manner, a standard packaging substrate (as well as standard die) can be employed to implement a myriad of IC designs.

Figure 3:
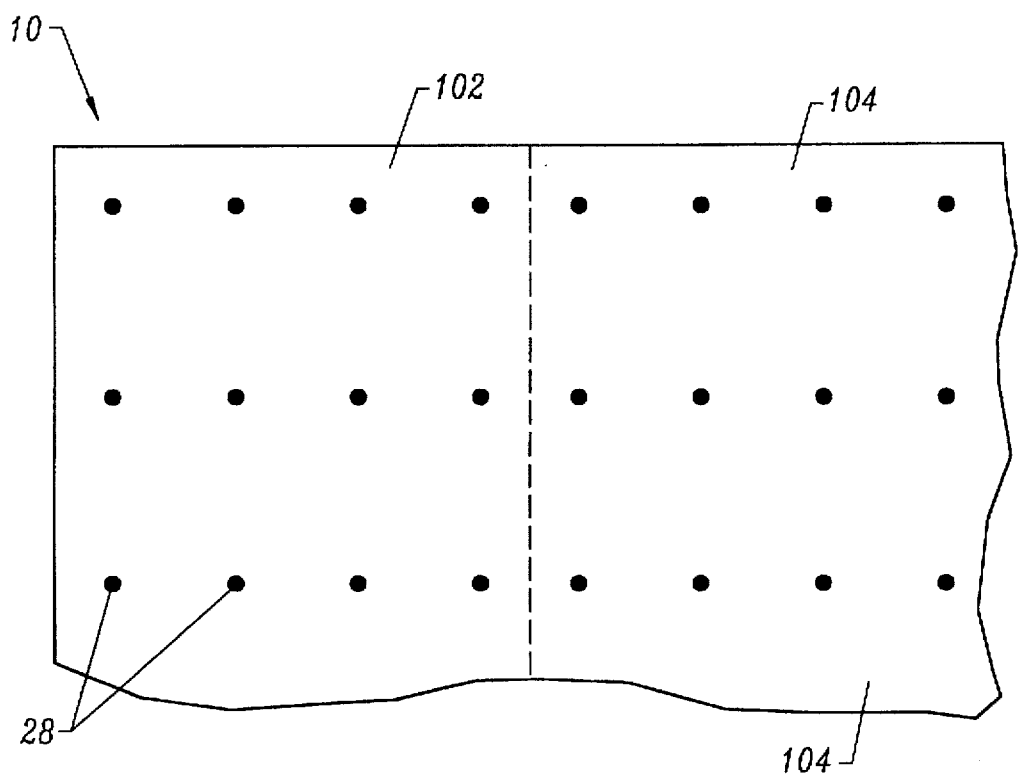
FIG. 3 shows the top view of a small portion of a die having a uniform array of solder pads, which solder pads are used to electrically connect device elements on the die to a packaging substrate.

Referring now to FIG. 3, a selected portion of a pad array formed in accordance with an embodiment of the present invention is shown. The surface of die 10 includes cells 102 and 104 such as base cells of a gate array. Each of the cells, in turn, is fully populated with solder pads 28, which are preferably arranged in an array. Now referring back to FIG. 1, solder pads 28 connect at contact points formed by metallization layer 30 and thereby establish an electrical connection between die 10 and packaging substrate 12 to form a pad array integrated circuit.

In order to form the pad array of this invention, only a single mask is required as opposed several masks. Thus, a die used for many applications may require only a single pad array mask, thereby greatly simplifying the procedure of making the die—which may then be used for many different applications (e.g., ASICs). In a preferred embodiment, as many pads will be printed as can be fit on the die active surface. The number of pads thus depends upon the size of the die and the fabrication technology's current lithographic/ processing constraints. To maximize flexibility, some pads may remain unused when the packaging substrate is mounted to the die. This of course depends upon the application and correspondingly the structure of the packaging substrate. Some packaging substrates will have no contacts at the locations of certain pads. Those are the pads that will therefore remain unused in the particular application.

In one embodiment of the present invention, die 10 contains no prespecified circuitry, only unwired solder pads 28 which will later be wired to one another to form circuit elements. As mentioned above, wiring may be accomplished by the network of conductive line layers 30 in packaging substrate 12, which may implement various circuit designs. It is the arrangement of these interconnections that defines the circuitry present in one embodiment on a given pad array IC. Thus, a solder pad array structure provides the flexibility to form many different types of ICs—such as for example memory chips and logic chips. The flexibility of implementing a customized circuit design by connecting the device elements of die 10 via the conductive pathways defined in the packaging substrate 12 provides an alternative to the metallization-on-die fabrication of conventional gate arrays. Now gate arrays or other customizable chips may be implemented partially in a package rather than entirely in on-chip. The fully populated array of solder pads on the flip chip die allows direct connection to each device element. Of course, some of these solder pads may go unused in some designs, just as some transistors in a gate array may go unused.

Figure 2:
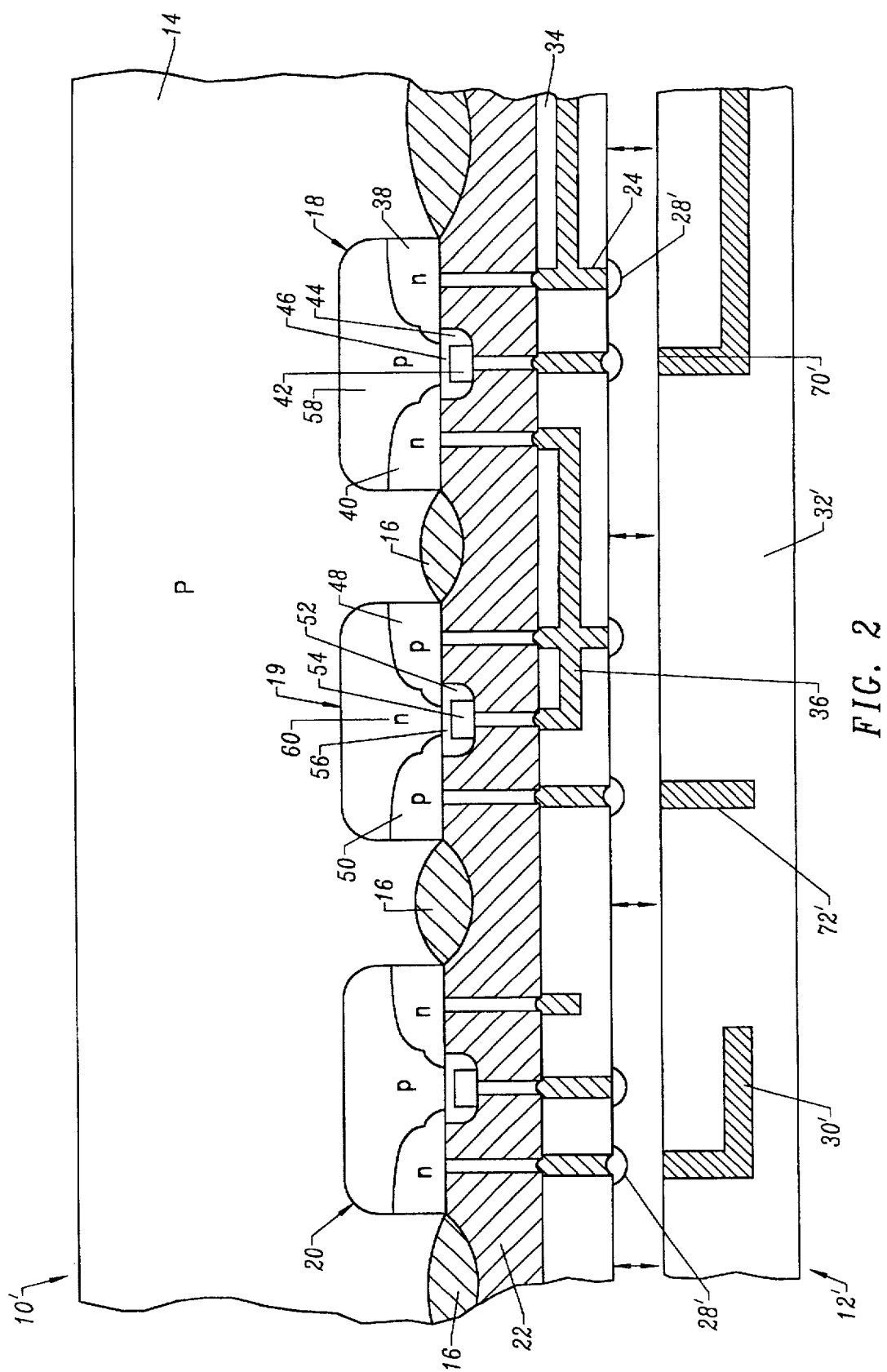
FIG. 2 shows a side-sectional view of a die and customized packaging substrate arrangement in a second embodiment of the present invention, in which some routing between the various transistor elements is formed on the die and the remaining wiring to complete the circuitry is formed on the packaging substrate.

FIG. 2 shows another embodiment of the present invention. In this embodiment, die 10' includes some limited wiring to form the prespecified circuitry on the substrate surface. Die 10' includes in large part the same components in die 10, e.g. substrate 14, components associated with devices 18, 19 and 20, field oxide region 16, passivation layer 22 and vias 24.

Conductive line layer 36 and insulating layer 34 are deposited on die 10' adjacent to passivation layer 22 to form the prespecified circuitry. Layers 36 and 34 contain wiring very similar to that shown in layers 30 and 32 of FIG. 1. In this configuration, interconnects 24 connect to metallization layers 36. Solder pads 28' cap conductive interconnects rising from metallization layer 36 and from device elements in the substrate.

As shown in FIG. 2, some solder pads 28' provide connections to underlying device elements while others provide connections to metallization layer lines that connect two or more device elements. For purposes of illustration, one of solder pads 28' provide a connection to source/drain 50 of device 19 and another of solder pads 28' provide a connection to metal lines connecting gate 54, source/drain 48 of device 19 and source/drain 40 of device 18.

Solder pads 28' connect to contact points 70' of packaging substrate 12' formed by conductive line layers 30'. Insulating layers 32' in a packaging substrate 12' separates conductive line layers 30' from each other. The various interconnect conductive line 30' positioned between insulating layers 32' are connected by vertical connections 72'. Packaging substrate 12' is basically similar in nature and composition to packaging substrate 12 of FIG. 1. As such packaging substrate 12' effectively connects to die 10' and forms a pad array IC (e.g., an ASIC).

A die 10' according to this embodiment is well suited for applications in which some limited wiring is provided on chip (by for example the manufacturer of a gate array). For such applications, some standard connections, defining prespecified circuitry between the transistors may be needed for a myriad of custom designs. The standard connections as contemplated could include either intracell or intercell routing or both. As a result, a potential user of the pad array of the present invention may not have to form as extensive a metallization structure as he/she would in the absence of prespecified circuitry at the substrate level.

The process of forming die 10, as shown in FIG. 1, will now be described. For illustration, the process of forming die 10 with a pad array on its face is discussed in light of the steps for fabricating devices 18 and 19. Die 10, as shown, is assumed to be doped p-type; there is no need therefore to form a separate well 58 for device 18. It should be understood that a local region of p-type doping serves as a well 58 for NMOS device 18. A separate n-type implant step is required to form a well 60 shown in PMOS device 19. This implant is formed by masking the NMOS device 18 while implanting phosphorous or arsenic ions, for example, in a dose and energy sufficient to form well region 60.

Sometime after the well region 60 is formed, a gate oxide layer is formed on the substrate, and then a polysilicon layer is formed on the gate oxide layer (typically by CVD deposition). The resulting polysilicon layer may be doped by ion implantation, masked, and etched to form gate electrodes 42 and 54. Gate oxides 46 and 56 from the gate oxide layer remain under gate electrodes 42 and 54, respectively.

After the gates have been formed, source/drain regions are formed by two or more ion implantation steps. Initially, two implants are performed to form n-type source/drain regions 38 and 40 of NMOS device 18 and p-type source/drain regions 48 and 50 of PMOS device 19. Typically, the NMOS transistor regions will be masked during the p-type implant and the PMOS transistor regions will be masked during the n-type implant. In this manner, the p-and n-type transistor groups are formed separately in the active layer.

The source/drain regions are completed after forming spacers 44 adjacent gate electrode 42 and spacers 52 adjacent gate electrode 54. The spacers may be formed by depositing a blanket layer of oxide on the wafer surface and then performing an anisotropic etch. After the spacers have been formed, an n-type implant may be performed to form heavily doped source/drain regions in NMOS device 18, and a p-type implant may be performed to form heavily doped source/drain regions in PMOS device 19.

A passivation layer 22 of, e.g., borophosphosilicate glass ("BPSG") is then deposited over the entire structure. Layer 22 is etched (typically by plasma etch) to create vias to provide access to the underlying transistor elements such as the source, drain and well regions of devices 18, 19 and 20. A diffusion barrier layer (sometimes referred to as "glue" layer) made of a material such as titanium nitride layer is formed to protect the device elements adjacent vias 24 from ingress of metal atoms from a conductive line layer that may be disposed above. In some processes, vias are filled with tungsten or other conductive material to form vertical interconnects 24 according to procedures known in the art.

Finally, the resulting structure is masked to define the solder pad array of densely populated solder pads and solder is deposited over vertical interconnects 24 to form solder pads 28. At this point, the front end processing is complete. Note again that only a single mask is required to define the solder pad array for all applications.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. A method of fabricating a die having a plurality of electronic devices and incomplete wiring therebetween, the method comprising the following steps:

forming said plurality of electronic devices on a semiconductor substrate;

forming a passivation layer over said electronic devices on said semiconductor substrate; from device elements of said plurality of electronic devices to an outer surface of said die; and forming a plurality of solder pads on said outer surface and in electrical contact with said conductive pathways, wherein said one or more patterned metallization layers and conductive pathways include insufficient wiring to and from said electronic devices to form an integrated circuit and wherein said outer surface includes an interior region disposed interior to a peripheral region of said outer surface and including at least some of said plurality of solder pads, and wherein at least some of the interior solder pads connect to input-output cells, and at least some other interior solder pads connect to power and ground connections, such that when said integrated circuit is connected to a packaging substrate including a power plane, ground plane and source of input-output signals, at least some of said multiple input-output cells connect to sources of input-output signals, at least some of said power connections connect to power plane and at least some of said ground connections connect to ground plane.

2. The method of claim 1, wherein said outer surface is a surface of a top dielectric layer formed over a top metallization layer.

3. The method of claim 1, wherein said step of forming a plurality of solder pads forms solder pads arranged evenly over the outer surface of said die.

4. The method of claim 1, wherein said step of forming a plurality of solder pads requires only a single mask and forms more solder pads than are necessary to complete wiring to form said integrated circuit.

5. The method of claim 1, further comprising a step of connecting said die to a packaging substrate through said solder pads, wherein said packaging substrate includes sufficient wiring to complete circuitry necessary to form said integrated circuit.

6. The method of claim 1, wherein said step of forming at least said first portion of conductive pathways comprises forming interconnects that connect to said plurality of electronic devices.

* * * * *